United States Patent
Wilby et al.

(10) Patent No.: US 11,521,840 B2
(45) Date of Patent: Dec. 6, 2022

(54) METHOD AND APPARATUS FOR CONTROLLING STRESS VARIATION IN A MATERIAL LAYER FORMED VIA PULSED DC PHYSICAL VAPOR DEPOSITION

(71) Applicant: SPTS Technologies Limited, Newport (GB)

(72) Inventors: Anthony Wilby, Newport (GB); Steve Burgess, Newport (GB); Ian Moncrieff, South Gouces (GB); Clive Widdicks, Newport (GB); Scott Haymore, Newport (GB); Rhonda Hyndman, Newport (GB)

(73) Assignee: SPTS Technologies Limited, Newport (GB)

( * ) Notice: Subject to any disclaimer, the term of this patent is extended or adjusted under 35 U.S.C. 154(b) by 164 days.

(21) Appl. No.: 15/899,634

(22) Filed: Feb. 20, 2018

(65) Prior Publication Data

US 2018/0308670 A1 Oct. 25, 2018

(30) Foreign Application Priority Data

Apr. 20, 2017 (GB) ...................................... 1706284
Sep. 28, 2017 (GB) ...................................... 1715726

(51) Int. Cl.
*C23C 14/35* (2006.01)
*H01J 37/34* (2006.01)
(Continued)

(52) U.S. Cl.
CPC ........ *H01J 37/3408* (2013.01); *B81B 3/0072* (2013.01); *C23C 14/345* (2013.01);
(Continued)

(58) Field of Classification Search
CPC .................................................. C23C 14/351
See application file for complete search history.

(56) References Cited

U.S. PATENT DOCUMENTS 4,871,433 A 10/1989 Wagner et al.
6,077,403 A * 6/2000 Kobayashi .............. C23C 14/35
204/192.12
(Continued)

FOREIGN PATENT DOCUMENTS

CN 101847598 A 9/2010
CN 102719798 A 10/2012
(Continued)

OTHER PUBLICATIONS

P.J. Kelly et al., "Magnetron sputtering: a review of recent developments and applications", Vacuum, vol. 56, No. 3, Mar. 31, 2000 (Mar. 31, 2000), pp. 159-172, XP055505403, GB ISSN: 0042-207X, DOI: 10.1016/S0042-207X(99) 00189-X.
(Continued)

*Primary Examiner* — Jason Berman
(74) *Attorney, Agent, or Firm* — Hodgson Russ LLP

(57) ABSTRACT

A method and apparatus are for controlling stress variation in a material layer formed via pulsed DC physical vapour deposition. The method includes the steps of providing a chamber having a target from which the material layer is formed and a substrate upon which the material layer is formable, and subsequently introducing a gas within the chamber. The method further includes generating a plasma within the chamber and applying a first magnetic field proximate the target to substantially localise the plasma adjacent the target. An RF bias is applied to the substrate to attract gas ions from the plasma toward the substrate and a second magnetic field is applied proximate the substrate to steer gas ions from the plasma to selective regions upon the material layer formed on the substrate.

7 Claims, 19 Drawing Sheets

(51) Int. Cl.
*B81B 3/00* (2006.01)
*C23C 14/50* (2006.01)
*H01J 37/32* (2006.01)
*H01L 21/02* (2006.01)
*C23C 14/34* (2006.01)
*H01L 21/285* (2006.01)
*H01L 21/768* (2006.01)

(52) U.S. Cl.
CPC ........ *C23C 14/3471* (2013.01); *C23C 14/351* (2013.01); *C23C 14/50* (2013.01); *C23C 14/505* (2013.01); *H01J 37/32669* (2013.01); *H01J 37/32715* (2013.01); *H01J 37/347* (2013.01); *H01J 37/3452* (2013.01); *H01J 37/3467* (2013.01); *H01J 37/3485* (2013.01); *H01L 21/02178* (2013.01); *H01L 21/02266* (2013.01); *H01L 21/2855* (2013.01); *H01L 21/76877* (2013.01); *B81C 2201/017* (2013.01); *B81C 2201/0181* (2013.01)

(56) References Cited

U.S. PATENT DOCUMENTS

| | | | |
|---|---|---|---|
| 6,143,140 A * | 11/2000 | Wang | C23C 14/046 204/192.12 |
| 6,342,134 B1 * | 1/2002 | Barber | C23C 14/0094 204/192.13 |
| 2002/0017910 A1 * | 2/2002 | Sakai | C23C 14/351 204/192.2 |
| 2010/0096255 A1 | 4/2010 | Ye et al. | |
| 2011/0048928 A1 * | 3/2011 | Kim | C23C 14/0623 204/192.25 |
| 2013/0101749 A1 * | 4/2013 | Yang | H01J 37/3405 427/523 |
| 2013/0319855 A1 * | 12/2013 | Li | H01J 37/3266 204/298.11 |
| 2015/0311046 A1 * | 10/2015 | Yeh | C23C 14/0036 204/192.17 |

FOREIGN PATENT DOCUMENTS

| | | |
|---|---|---|
| EP | 0173164 A1 | 8/1984 |
| JP | H07110912 A | 4/1995 |

OTHER PUBLICATIONS

CNIPA, Office Action for CN201810230437.2, dated Jun. 11, 2020.
Ge et al., "Plasma science and technology and its application in industry", pp. 156-157, 2011.
CNIPA, Rejection Decision for CN Application No. 201810230437.2, dated Jun. 17, 2021.

* cited by examiner (a)

(b)

A=36.5mm central region
B=80mm central region
C=125 central region

METHOD AND APPARATUS FOR CONTROLLING STRESS VARIATION IN A MATERIAL LAYER FORMED VIA PULSED DC PHYSICAL VAPOR DEPOSITION

BACKGROUND

The present invention relates to a method and apparatus for controlling stress variation in a material layer formed via physical vapour deposition.

Micro electro-mechanical systems incorporate devices which often exploit the piezoelectric properties of materials such as aluminium nitride, and bimetallic nitrides such as aluminium scandium nitride. The material is typically deposited upon a substrate, such as a wafer, using a physical vapour deposition technique and the stress profile within the material is found to be a key factor influencing the operational characteristics of the device. The material deposition across the wafer can vary significantly and as such, the devices formed on the same wafer often have different operational characteristics.

In an endeavour to achieve uniform characteristics of devices formed on a wafer, the plasma profile across the chamber is arranged to generate sputtered material uniformly across the wafer to achieve uniform thickness of the deposited material. It is also preferable to produce textured growth of the layer oriented to an [002] crystallographic plane and the key requirements for generating the textured growth comprise a high vacuum ($<1\times10^{-7}$ Torr) and a high wafer temperature, such as $>300°$ C.

The stress profile across a layer formed using physical vapour deposition is principally dependent on two factors: wafer temperature and ion bombardment on the layer. High wafer temperatures are found to create large tensile stresses within the layer as the wafer cools and contracts. Moreover, since the wafer temperature is substantially uniform during the deposition, then in the absence of any bias voltage, the deposition is uniform upon the wafer (owing to the uniform condensation of material onto the wafer surface). However, it is found that as the wafer cools and contracts, the stress within the material layer collapses at the centre of the wafer, as the layer cracks and relaxes, as illustrated graphically in FIG. 1 of the drawings.

When a suitable voltage difference is applied to the wafer, ions within the plasma become attracted to the wafer and strike the material deposited thereon, compacting the deposited layer to a more compressive state which helps control average stress within the layer. The voltage difference can reduce the tensile stress variation within an aluminium nitride layer for example from 900 MPa to 100 MPa, by increasing ion bombardment upon the layer. As the voltage difference increases however, it is found that the stress profile becomes non-uniform owing to the plasma profile across the chamber, as illustrated graphically in FIG. 2 of the drawings.

The plasma within the chamber is typically confined to a localised region within the chamber by a rotating magnetic field, and this field preferentially generates ions adjacent annular regions of the wafer. The increase in ion density adjacent the annular regions results in a greater bombardment of ions on the layer adjacent these annular regions. In particular, it is found that the layer undergoes more ion bombardment proximate an outer periphery thereof, than at the centre, which subsequently leads to a more tensile central region and a more compressive periphery of the layer, which results in the layer cracking as the wafer contracts.

SUMMARY

We have now devised a method and apparatus which address at least some of the above mentioned problems.

In accordance with the present invention, as seen from a first aspect, there is provided a method of controlling stress variation in a material layer formed via pulsed dc physical vapour deposition, the method comprising the steps of:

providing a chamber comprising a target from which the material layer is formed and a substrate upon which the material layer is formable;

introducing a gas within the chamber;

generating a plasma within the chamber;

applying a first magnetic field proximate the target to substantially localise the plasma adjacent the target;

applying an RF bias voltage to the substrate;

applying a second magnetic field proximate the substrate to steer gas ions from the plasma to selective regions upon the material layer formed on the substrate, wherein the gas ions steered by the second magnetic field are substantially unaffected by the first magnetic field.

Magnetic fields generated at various points across the substrate and in various interacting patterns can be used to create localized areas of increased ion flux at the layer surface due to the Lorentz force. This force arises from the cross-product of the applied electric field between the target and the substrate and the second magnetic field adjacent to the wafer. While the first magnetic field is found to influence wafer thickness uniformity and the useful life of the target, the second magnetic field can be tuned independently to provide an optimum stress uniformity across the substrate.

In an embodiment, the second magnetic field is applied at a central portion of the substrate. For example, the substrate may comprise a silicon wafer having a planar disk-like shape and the second magnetic field may be applied at a centre of the wafer. Since the stress state of a deposited layer is related to temperature and ion bombardment, an increase in ion bombardment results in a reduction in tensile stress in the area with the greatest magnetic flux perpendicular to the electric field, which is typically perpendicular to the wafer surface. To achieve a reduced within wafer stress variation the ideal placement for the second magnetic fields would be the centre of the substrate so as to increase ion bombardment in the centre of the wafer and thus reduce the relative tensile stress in the central region.

In an embodiment, the method further comprises rotating the second magnetic field relative to the substrate. The rotation may take place about an axis which extends substantially perpendicular to the substrate.

In an embodiment, the method comprises rotating the second magnetic field relative to the substrate as the material layer is formed. The method further comprises a plurality of deposition steps for forming the material layer, and the substrate is rotated relative to platen prior to commencing each step.

In an embodiment, the substrate is rotated through a angular range of $360°/n$ relative to the platen, between each deposition step, where n is the number of deposition steps.

In an embodiment, the method comprises introducing nitrogen and/or argon gas into the chamber. In an embodiment, the substrate comprises a silicon wafer and the target comprises aluminium.

In accordance with the present invention as seen from a second aspect, there is provided apparatus for controlling stress variation in a material layer formed via pulsed dc physical vapour deposition, the apparatus comprising:

a chamber for housing a target from which the material layer is formed and a substrate upon which the material layer is formable, the chamber comprising an inlet for introducing a gas into the chamber;

a plasma generating arrangement for generating a plasma within the chamber; and, a voltage source for in use applying an RF bias voltage to the substrate;

wherein the apparatus further comprises a first magnetic field generating arrangement configured to in use generate a first magnetic field proximate the target for localising the plasma adjacent the target, and a second magnetic field generating arrangement for generating in use a second magnetic field proximate the substrate to steer gas ions from the plasma to selective regions upon the material layer formed on the substrate, and wherein the gas ions steered by the second magnetic field are substantially unaffected by the first magnetic field.

In an embodiment, the first magnetic field generating arrangement comprises a magnetron assembly.

In an embodiment, the second magnetic field generating arrangement comprises a plurality of magnets configured to an array. The second magnetic field generating arrangement is disposed at a side of the substrate which is opposite a side of the substrate facing the plasma. Preferably, in use a centre of the array is configured to extend adjacent a centre of the substrate.

In an embodiment, the apparatus further comprises means for rotating the second magnetic field generating arrangement relative to the substrate.

In an embodiment, the plurality of magnets are disposed within a cassette. Spinning the cassette and thus the second magnetic field generating arrangement desensitises the deposition process to small variations in the second magnetic field attributable to a position of the magnets, for example.

In an embodiment, the means for rotating the second magnetic field comprises a spindle rotationally coupled with the cassette. The spindle and cassette are rotationally driven via a motor.

In an embodiment, north-south axes of the magnets of the array extend substantially parallel to each other. Preferably, the north-south axes extend substantially perpendicular to the substrate.

In an embodiment, the magnetic pole disposed adjacent the substrate is the same for each magnet. In an alternative embodiment, the magnetic poles disposed adjacent the substrate for adjacent magnets of the array are different poles. Accordingly, in this latter embodiment, the magnetic poles disposed adjacent the substrate preferably alternate between north and south magnetic poles, around the array.

The first and second magnetic fields do not substantially interact and as such, the plasma is substantially unaffected by the second magnetic field, and the ions attracted toward the substrate are substantially unaffected by the first magnetic field. Experiments have shown that at 15 mm from the substrate the second magnetic field strength is reduced by over 90%, and at a separation from the substrate corresponding to the location of the target, the second magnetic field strength is reduced to background levels.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments.

Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

BRIEF DESCRIPTION OF THE DRAWINGS

The invention may be performed in various ways, and, by way of example only, embodiments thereof will now be described, reference being made to the accompanying drawings in which.

DETAILED DESCRIPTION OF EMBODIMENTS

Figure 1:
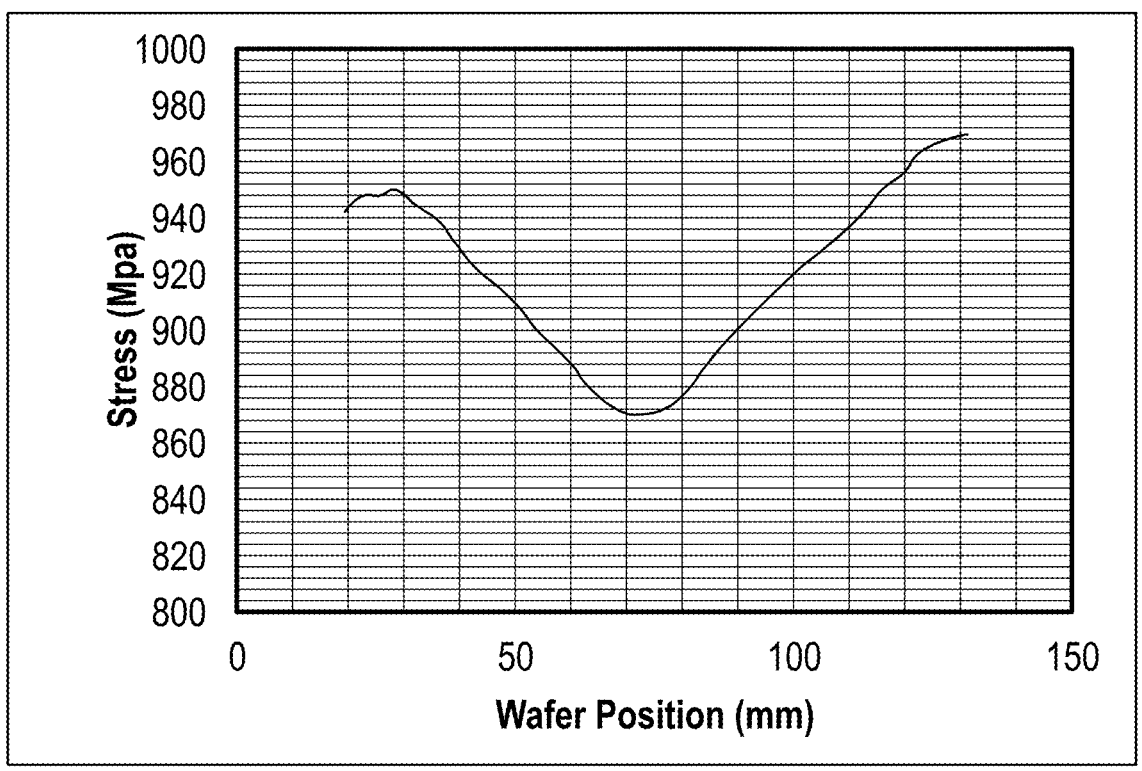
FIG. 1 is a graphical representation of the typical variation in stress across an aluminium nitride layer deposited upon a silicon wafer.
Figure 2:
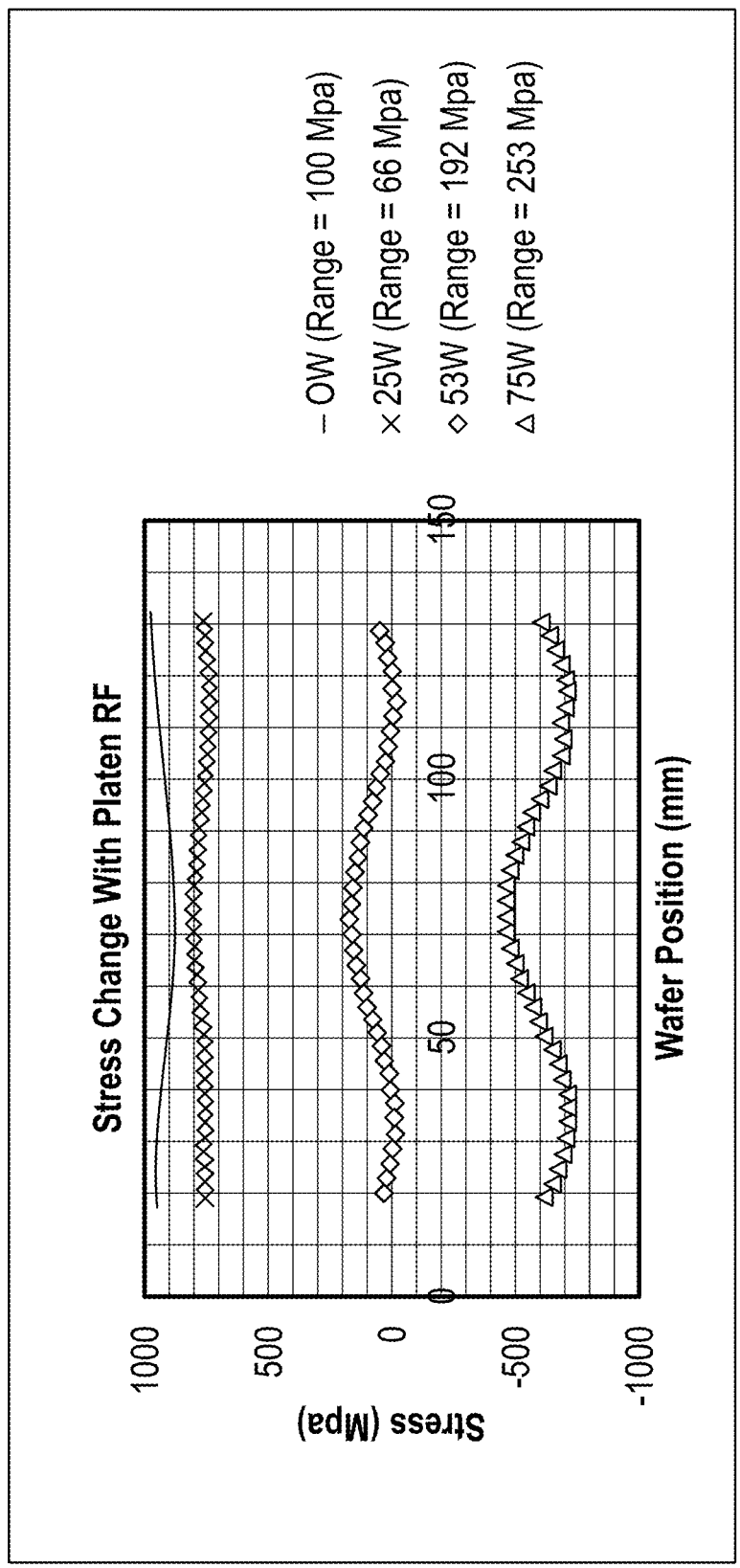
FIG. 2 is a graphical representation of the variation in stress across an aluminium nitride layer deposited on a silicon wafer, under different RF bias conditions.
Figure 3:
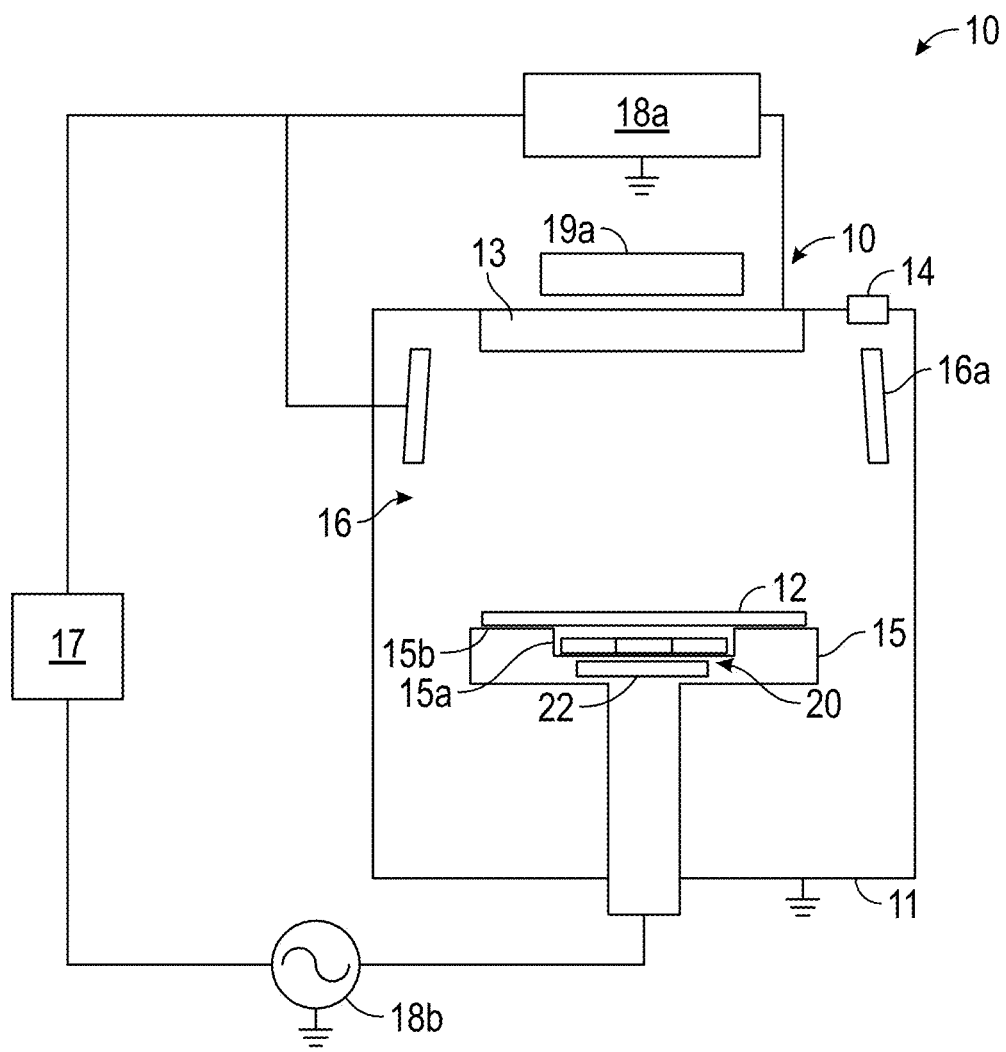
FIG. 3 is a schematic representation of an apparatus for controlling stress variation in a material layer formed via physical vapour deposition, according to an embodiment of the present invention.

Referring to FIG. 3 of the drawings there is illustrated a schematic representation of an apparatus 10 for controlling stress variation in a material layer (not shown) formed upon a substrate via physical vapour deposition, according to an embodiment of the present invention. The apparatus 10 comprises an electrically grounded processing chamber 11 within which the physical vapour deposition process takes place. The chamber 11 is arranged to house a substrate, such as a silicon wafer 12, and a source or target material 13, which may comprise a planar layer of metal, such as aluminium disk, which is to be used to form a sputtered layer on the silicon wafer 12. The chamber 11 further comprises an inlet 14 for coupling with a source of gas (not shown), such as a noble gas krypton, neon or argon, for example and a reactive gas such as nitrogen to form a nitride film or oxygen to form an oxide film. The apparatus 10 further comprises a platen 15 upon which the wafer 12 is sited within the chamber 11. The platen 15 is disposed within the chamber 11 such that the wafer 12 is positionable in a substantially parallel orientation with the planar target 13 and such that a wafer axis which extends through a centre of the wafer, substantially perpendicular thereto, is substantially aligned with a target axis which extends substantially perpendicular to a plane of the target 13.

The apparatus 10 further comprises a plasma generating arrangement 16 for generating a plasma within the chamber 11 and in the embodiment illustrated, the plasma is generated by applying pulsed (direct current) DC power between the target 13 and an anode ring 16a disposed within the chamber 11, from a DC power supply 18a. Radio frequency (RF) power is also applied to the platen 15 from an RF power supply 18b in order to provide an RF bias voltage to the wafer 12 via the platen 15. Typically, the platen 15 is driven at 13.56 MHz out of convention, although the invention is not limited in this regard. The operation of the power supplies is controlled with a controller 17 having a suitable graphical user interface (not shown).

The apparatus further comprises a first magnetic field generating arrangement 19, which is configured to generate a magnetic field proximate the target 13 for localising the plasma around the target 13, and a second magnetic field generating arrangement 20 for generating a magnetic field proximate the wafer 12. The first magnetic field generating arrangement 19 may comprise a magnetron assembly 19a for example, which is disposed outside of the chamber 11, at the side of the target 13 which is opposite the side facing the substrate 12 and which is arranged to rotate around an axis which extends substantially transverse to the target 13. The second magnetic field generating arrangement 20 may comprise a planar array of permanent disk magnets 21. However, it is to be appreciated that the permanent magnets 21 may be replaced with electromagnets (not shown).

The magnets 21 are placed on the platen 15 in the desired array, such that the north-south axes of the magnets 21 extend substantially parallel to each other and in a first configuration, the magnets 21 of the array are configured such that alternate magnets around the array comprise alternate poles arranged uppermost. In this respect, the uppermost magnetic poles of the magnets 21 may alternate between north and south around the array. In a second configuration however, the magnets 21 may be arranged so that the same pole (i.e. north pole) of each magnet 21 is arranged uppermost.

Figure 4:
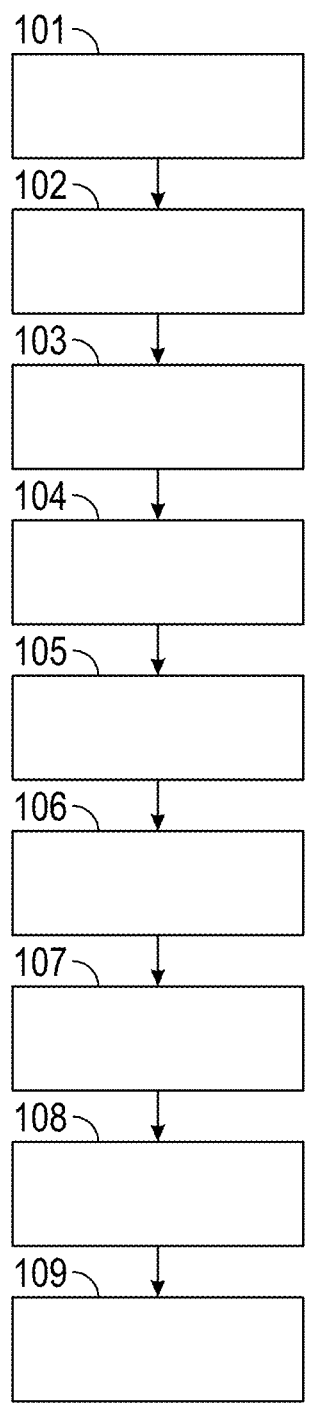
FIG. 4 is a flow chart illustrating the steps associated with a method of controlling stress variation in a material layer formed via physical vapour deposition according to a first embodiment of the present invention.

Referring to FIG. 4 of the drawings, there is illustrated a flow chart which outlines the steps associated with a method 100 of controlling stress variation in a material layer formed via pulsed DC physical vapour deposition, according to a first embodiment of the present invention. When it is desired to form a material layer, such as aluminium nitride or aluminium scandium nitride, on a substrate, such as a silicon wafer 12, the magnetic array 20 is placed on the platen 15 at step 101 and the wafer 12 is placed over the array 20 at step 102. The platen 15 may comprise a recess 15a for example for receiving the magnetic array 20, such that the wafer 12 extends over the array 20 upon the platen surface 15b. The aluminium target 13 is also disposed within the chamber 11 at step 103 and a gas (not shown), which may comprise nitrogen or argon or a nitrogen/argon mixture is introduced into the chamber 11 at step 104 via the inlet 14.

By applying a pulsed DC potential between the anode ring 16a and the target 13 at reduced pressure while rotating the magnetron assembly 19a, a plasma is generated in the chamber 11, at step 105. The magnetron assembly 19a generates a magnetic field proximate the target 13 for localising the plasma and thus the gas ions around the target 13. This localisation encourages the interaction of the gas ions within the target 13 and thus facilitates the release of aluminium atoms therefrom.

At step 106, an RF bias is applied to wafer 12 by RF power supply 18b. This electrical bias results in an electric field which is directed substantially perpendicular to the wafer surface and results in the positively charged gas ions becoming attracted toward the wafer 12 (during one half cycle of the RF voltage waveform). The ions strike the surface of the wafer 12 and thus compact the deposited layer of aluminium atoms, which results in a more compressed layer. The ion density striking the wafer 12 varies across the wafer 12 owing to a variation in the ions generated within the plasma. The plasma profile is dependent on the magnetic field from the magnetron 19a and regions of high magnetic field create concentrated regions of plasma and thus gas ions. It is found that magnetrons used in physical vapour deposition processes generate regions of high ion density proximate a peripheral region of the target 13 which thus results in an increased release (namely erosion) of target material from the periphery thereof compared with a central region. Moreover, this increased ion density results in a more concentrated bombardment of ions upon the wafer 12 around a peripheral region thereof compared with the central region.

However, the interaction of the RF bias voltage and the magnetic field of the array 20 generates a force, namely the Lorentz force, on the moving gas ions. The force is dependent on the cross product of the electric field generated by the RF bias, and the magnetic field from the array 20. A maximum force is exerted upon the gas ions when the magnetic field from the array 20 and electric field are perpendicular to one another. This force thus acts to preferentially re-direct or steer the ions onto regions of the wafer 12 where the electric and magnetic fields are perpendicularly orientated, resulting in an increase in gas ion density at these regions on the layer.

Figure 5B:
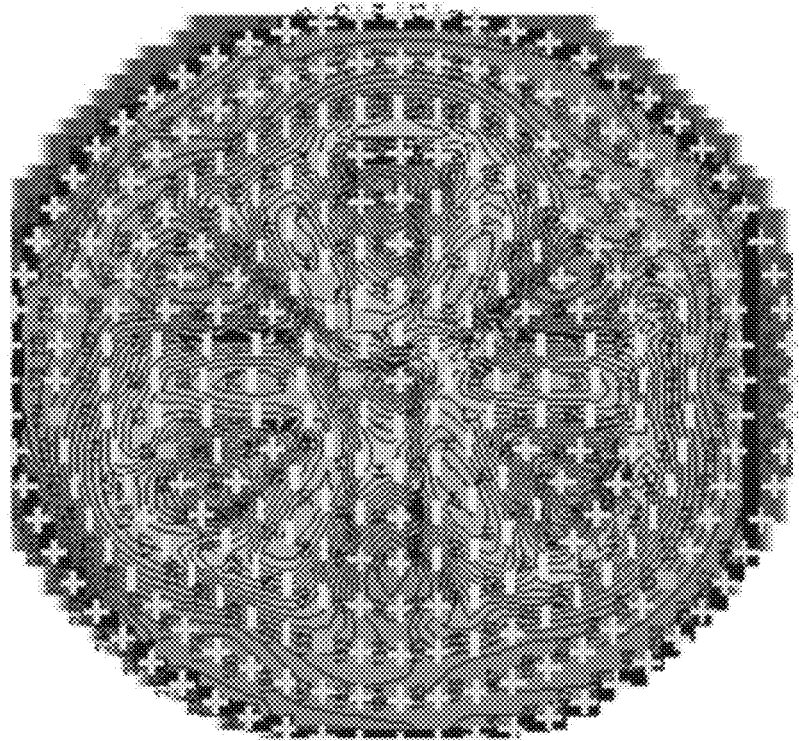
FIG. 5(b) is a contour map illustrating the relative thickness of an aluminium nitride layer formed on the wafer with the magnets arranged in the first configuration.
Figure 5A:
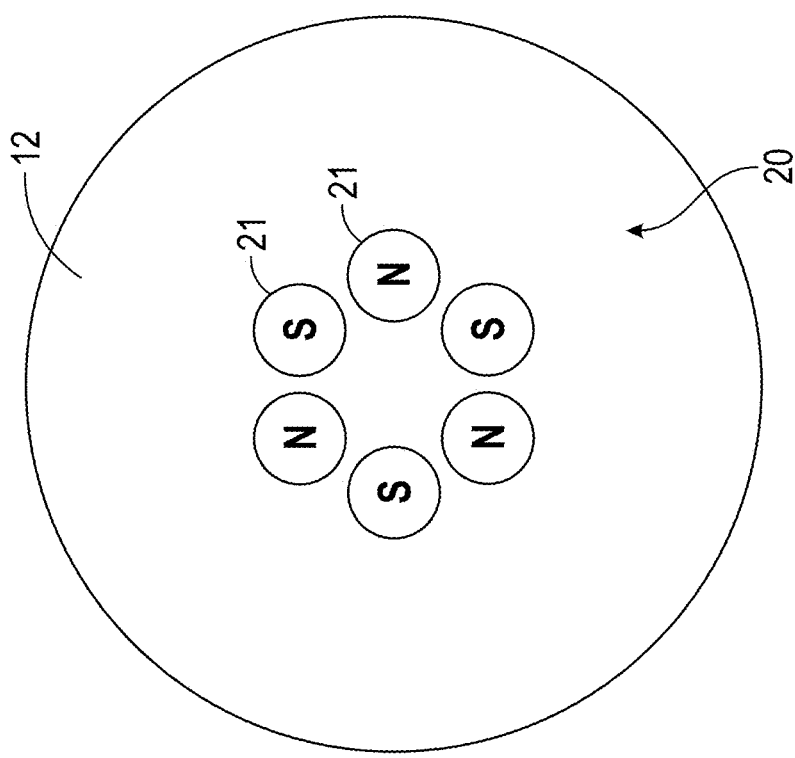
FIG. 5(a) is a plan view of the platen with the magnets arranged in a first configuration.
Figure 6:
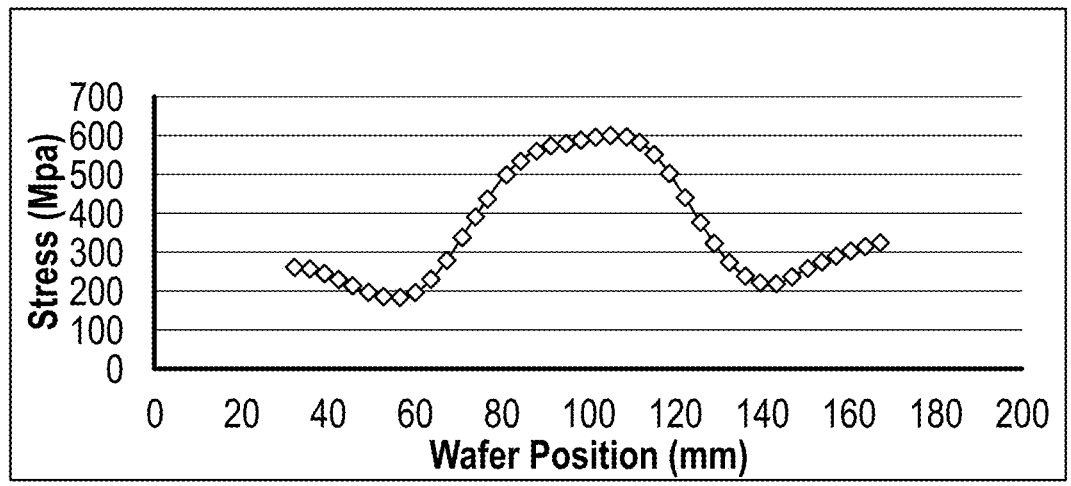
FIG. 6 is a graphical representation of the variation in stress across an aluminium nitride layer deposited upon a silicon wafer (a) in the presence of the first configuration of magnets, (b) with no magnetic influence.
Figure 6:
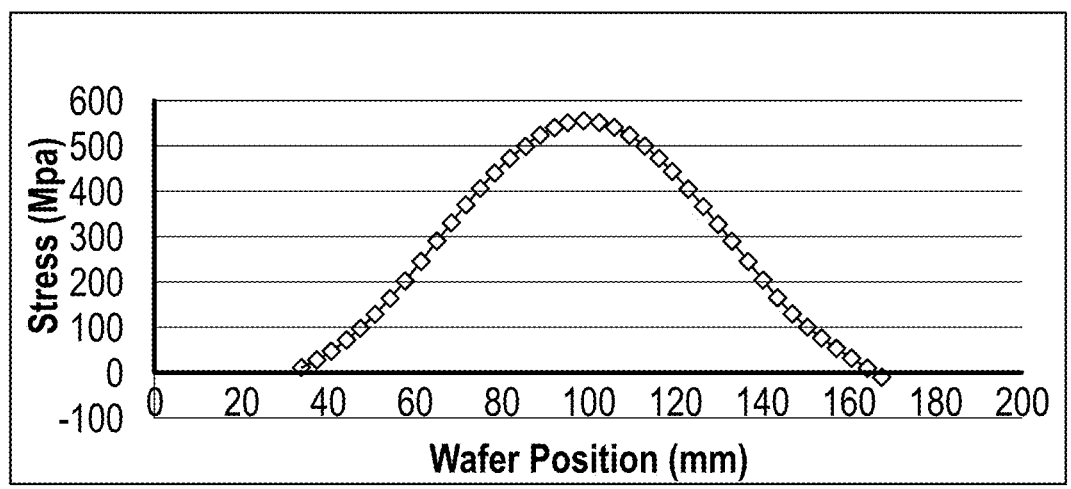

The array 20 is arranged to extend in a plane which is substantially parallel with the plane of the wafer 12 and as such, the magnetic field generated by the array 20 configured in the first configuration provides for a maximum force upon the gas ions at a position between adjacent magnets of the array 20, and at a position which is radially inward of the array. Referring to FIG. 5a there is illustrated a plan view of the magnets 21 configured according to the first configuration disposed upon the platen 15 and FIG. 5b illustrates the relative thickness of the layer formed upon the wafer 12. Regions of reduced layer thickness are indicated with a "−", whereas regions of increased layer thickness are indicated with a "+". The gas ions become steered to a central region of the wafer 12 in addition to regions disposed between the magnets 21, and thus act to compact a central region of the layer which results in a reduced layer thickness upon the wafer 12 at the central region. Moreover, upon referring to FIG. 6, it is evident that the stress variation over the central region of the wafer 12 is substantially reduced compared with the stress variation illustrated in FIG. 6b where no magnetic array is present during the deposition process.

Figure 7B:
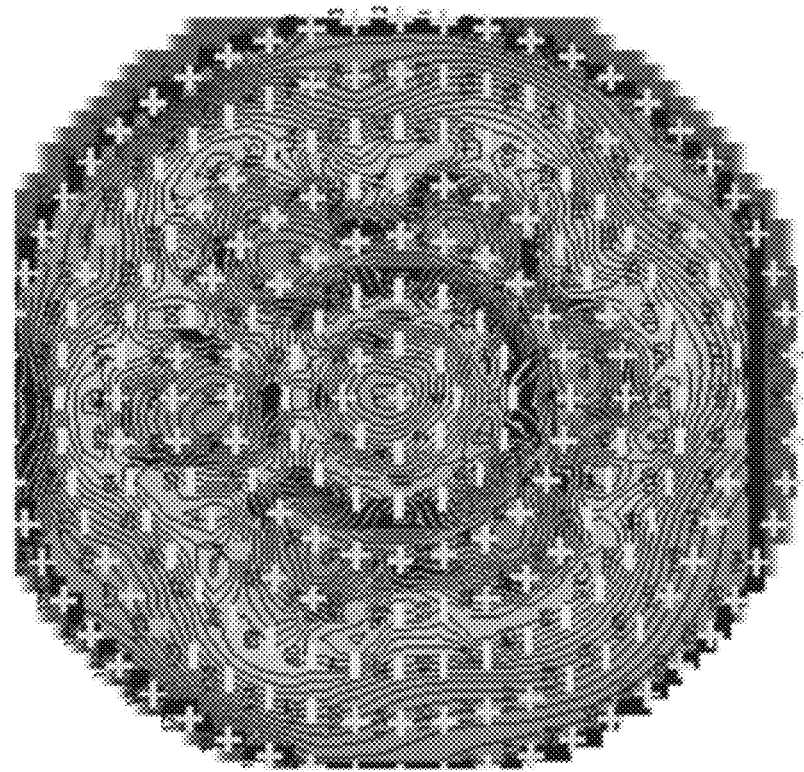
FIG. 7(b) is a contour map illustrating the relative thickness of the layer formed on the wafer with the magnets arranged in the second configuration.
Figure 7A:
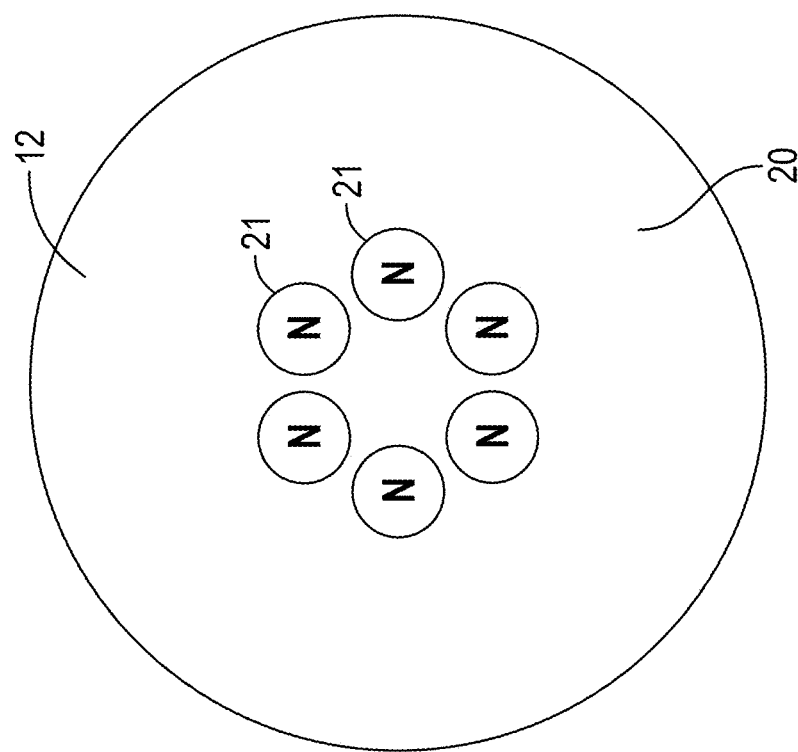
FIG. 7(a) is a plan view of the platen with the magnets arranged in a second configuration.
Figure 8:
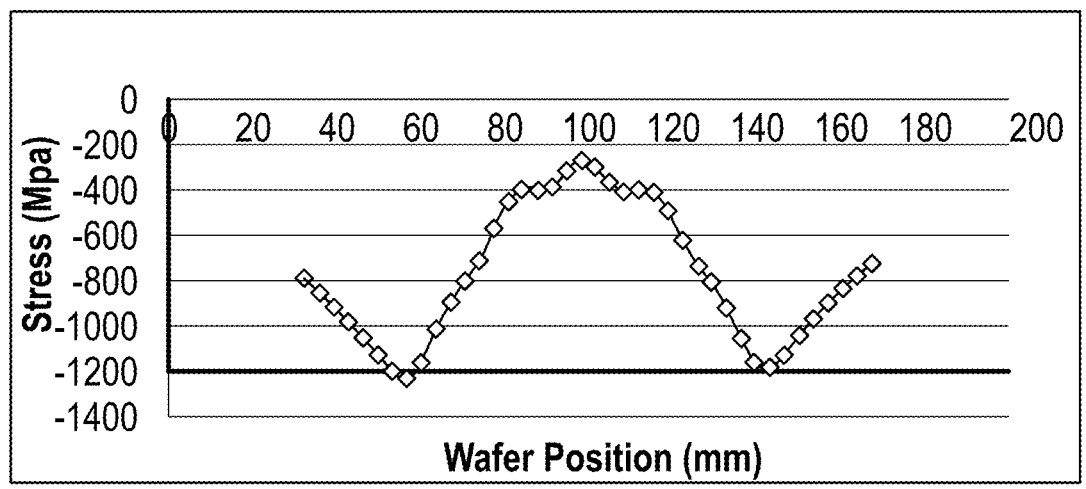
FIG. 8 is a graphical representation of the variation in stress across an aluminium nitride layer deposited upon a silicon wafer in the presence of the second configuration of magnets.

Referring to FIG. 7a there is illustrated a plan view of the magnets 21 configured in the second configuration disposed upon the platen 15 and FIG. 7b illustrates the relative thickness of the layer formed upon the wafer 12. The magnetic field generated by the array 20 provides for a maximum force upon the gas ions at a position which is radially inwardly and outwardly of the array 20. Similarly, regions of reduced layer thickness are indicated with a "−", whereas regions of increased layer thickness are indicated with a "+". The gas ions become steered to a central region of the wafer 12 and thus act to compact a central region of the layer which results in a reduced layer thickness upon the wafer 12 at the central region. Moreover, upon referring to FIG. 8, it is evident that the stress variation over the central region of the wafer 12 is substantially reduced.

Figure 9:
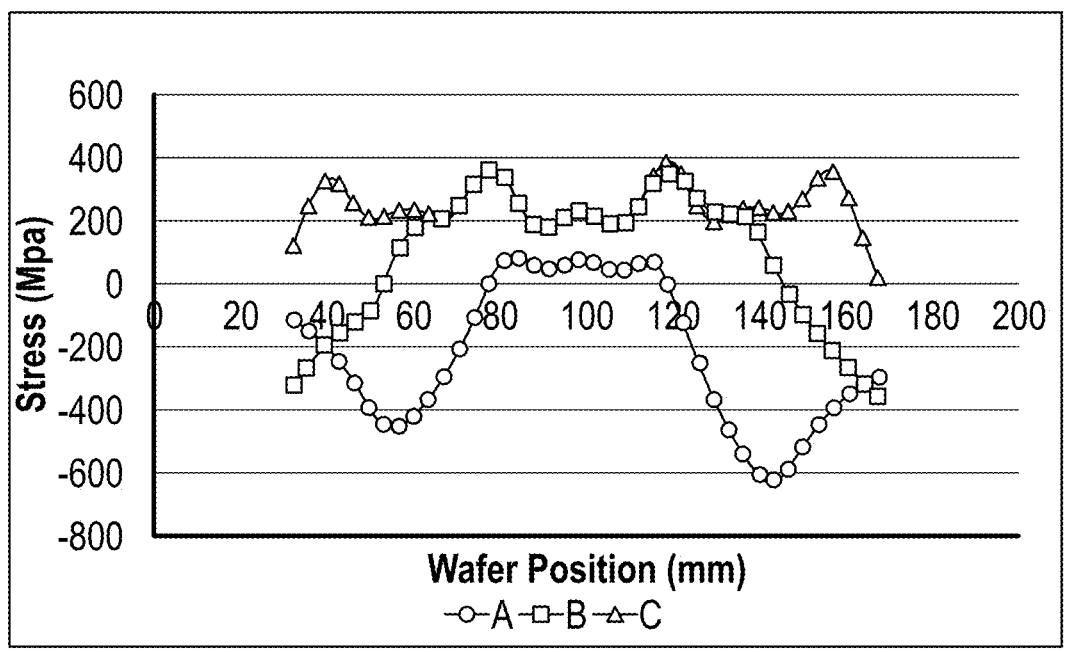
FIG. 9 is a graphical representation of the variation in stress across an aluminium nitride layer deposited upon a silicon wafer with increasing separation of magnets within the array.

Referring to FIG. 9 of the drawings, there is illustrated a graphical representation of the stress variation in an AlN layer formed via pulsed DC physical vapour deposition over 200 mm diameter wafers, in situations where the magnetic array 20 separately comprises a central region having a diameter of 36.5 mm, 80 mm and 125 mm. The stress variation in the central region is seen to remain substantially uniform irrespective of the diameter of the central region (namely the separation of the magnets 21).

Figure 10:
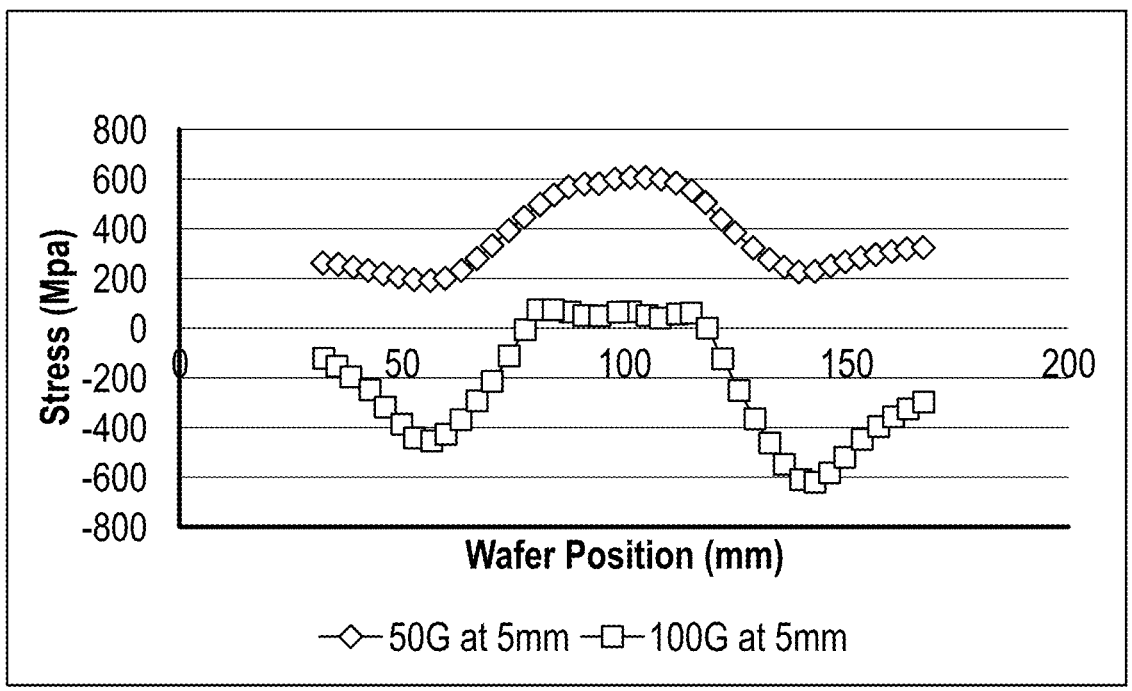
FIG. 10 is a graphical representation of the variation in stress across an aluminium nitride layer deposited upon a silicon wafer with different magnetic field strengths of the magnetic array; and, FIG. 11 is a graphical representation of the variation in magnetic field strength between the target and the substrate.

Upon referring to FIG. 10 of the drawings, it is also evident that the strength of the magnetic field generated by the array 20 does not need to be particularly strong to suitably steer the gas ions onto the wafer 12. For example, a horizontal field strength of 50 G at 5 mm above the wafer surface produces flattening of the stress profile over the central region of the layer. As this magnetic field strength is increased to 100 G for example, then the flattening is seen to become more pronounced. It is envisaged that increasing the magnetic field strength of the array 20 may provide reducing levels of stress variation across the layer, up to a threshold field strength, but if the magnetic field is increased beyond the threshold, then it is envisaged that the magnetic field may interfere with the magnetic field of the magnetron 19a.

Figure 11:
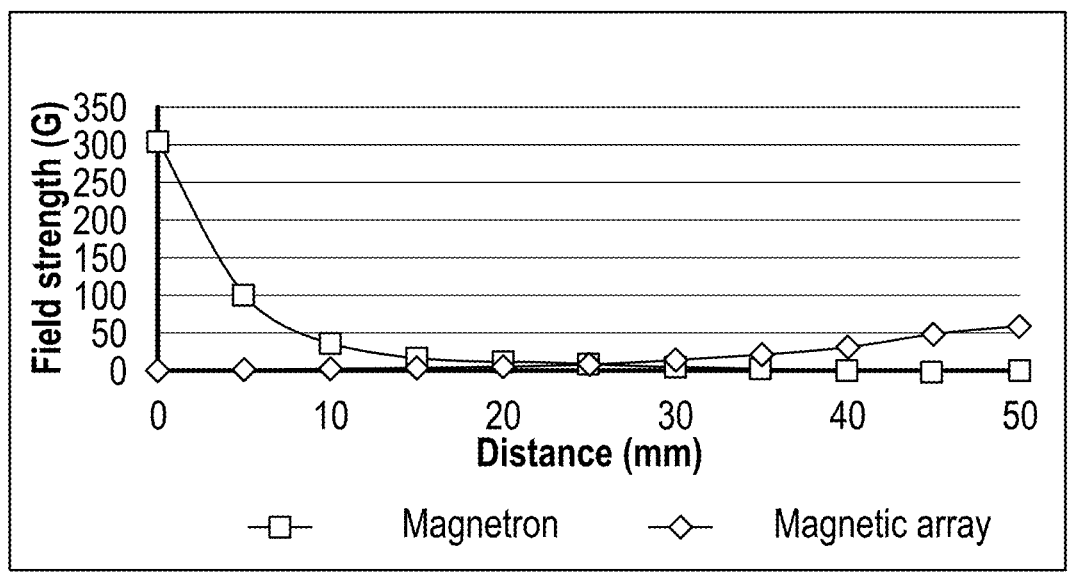

In the above described embodiment, the wafer 12 is separated from the target 13 by >25 mm and as such the magnetic field generated by the magnetron 19a drops to background levels before reaching the wafer surface. Similarly, the magnetic field generated by the array 20 reduces to background levels before reaching the target 13. This results in a minimal interaction between the magnetic field of the magnetron 19a and the array 20 and upon referring to FIG. 11 of the drawings, it is clear that at >25 mm target 13 to wafer 12 separation (namely proximate the wafer), the dominant magnetic field is that produced by the array 20.

Following the formation of the layer upon the wafer 12, the pulsed DC supply 18a and the RF bias supply 18b are switched off at step 107. The chamber may then be evacuated via an outlet (not shown) at step 108 and the wafer 12 with the layer formed thereon removed at step 109, for further processing for example.

In order to further reduce stress variations in the wafer 12, it is desirable to partition the deposition process into discrete deposition steps, whereby the wafer 12 is rotated relative to the platen 15 after each step. This rotation is found to reduce any local variations in magnetic field which may otherwise lead to local variations in the thickness of the sputtered film and wafer stress. To achieve a satisfactory averaging of the magnetic field, a large number of discrete deposition steps are required. However, this is not a practical solution as the process requires considerable time in generating the sputtered film and as such a reduced throughput. Moreover, it is found that even when a large number of discrete steps are used, the film exhibits a depth non-uniformity that correlates to the non-uniform static magnetic field.

Accordingly, to provide for a more uniform magnetic field from the array 20, the apparatus 10 in FIG. 3 further comprises a drive assembly 22 for rotating the magnetic array 20 relative to the wafer 12 and the method may further comprise rotating the magnetic array 20 relative to the wafer 12 using the drive assembly 22. This rotation may comprise a continuous rotation or a stepped rotation in which the magnetic field and wafer remain stationary relative to each other for a predefined period. Relative rotation between the magnetic field and the wafer 12 is found to reduce the differences in compaction of the layer over the wafer surface and thus provides for a more uniformly compacted layer. Moreover, this uniform compaction further reduces the tensile stress within the layer and thus reduces the stress variation in the layer.

Figure 12:
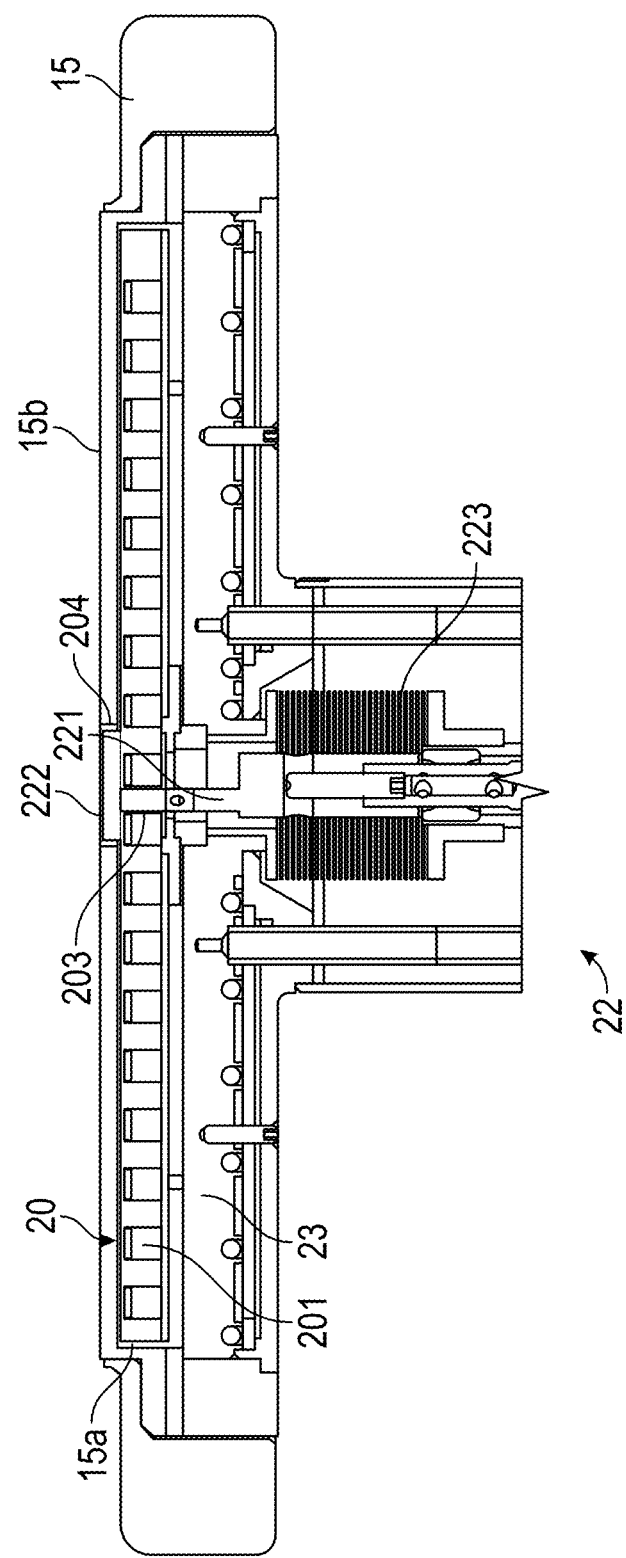
FIG. 12 is a cross-sectional view through a platen showing a drive assembly with the central wafer lift arranged in a lowered configuration.
Figure 13:
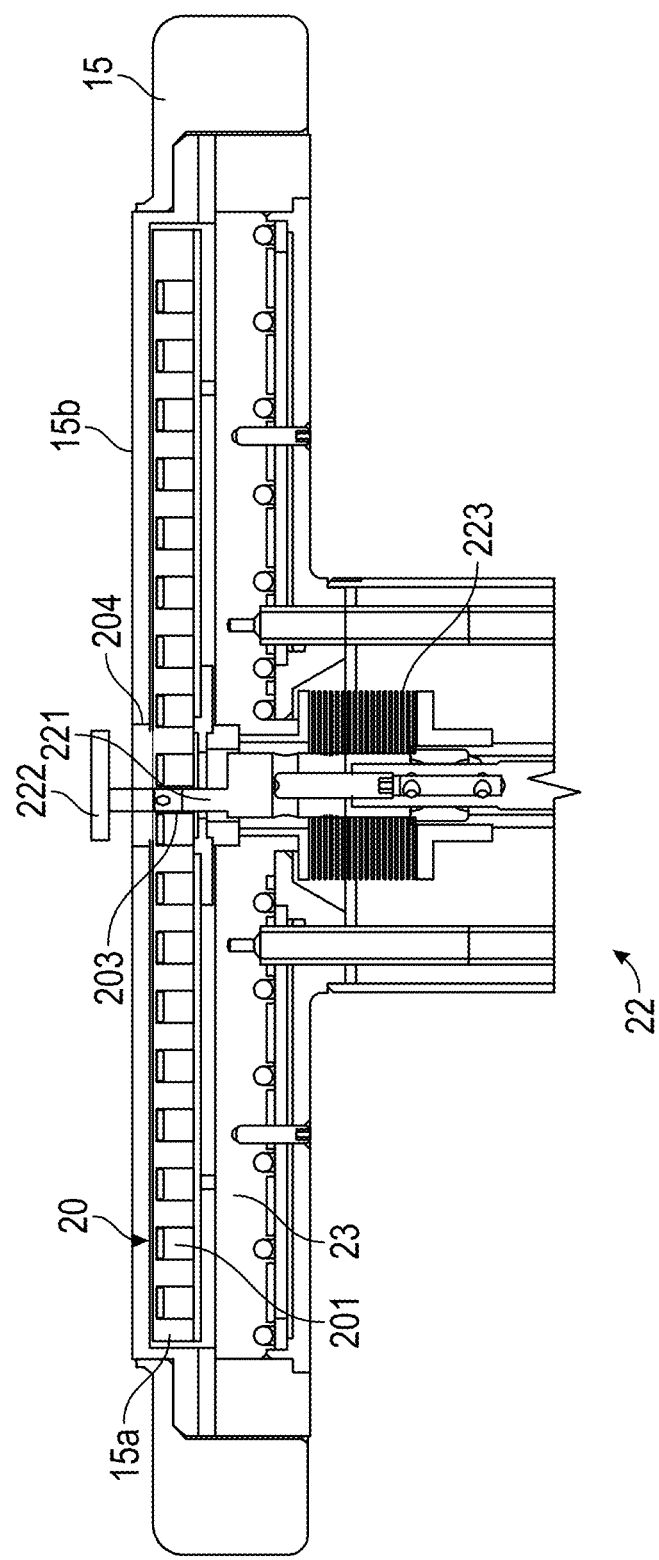
FIG. 13 is a cross-sectional view through a platen showing a drive assembly with the central wafer lift arranged in a raised configuration.
Figure 14:
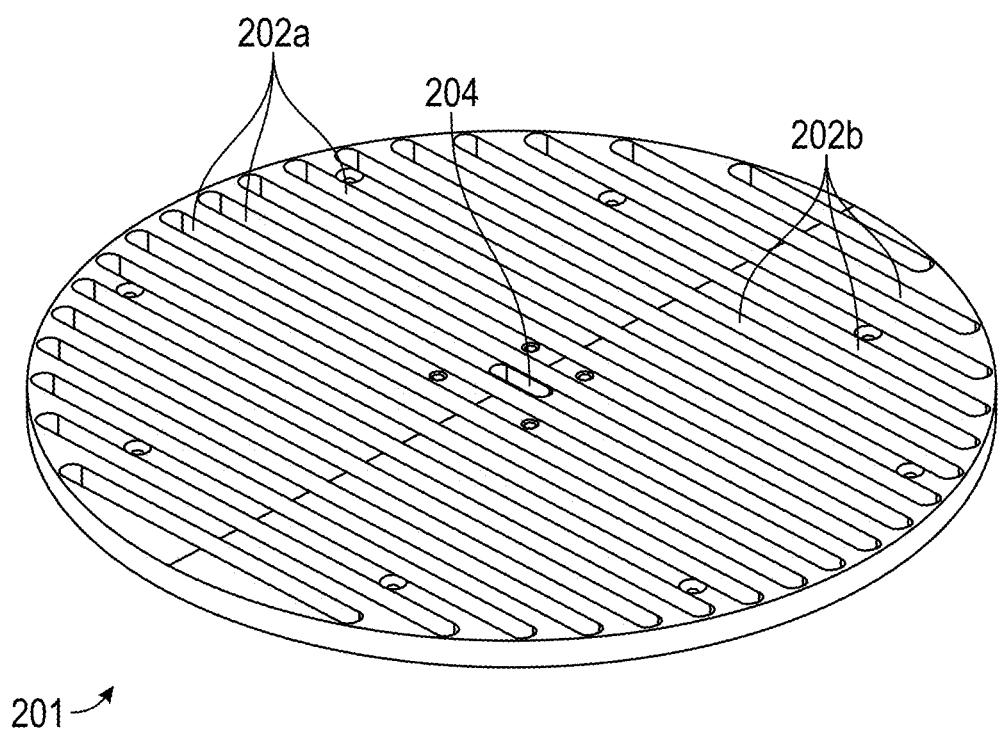
FIG. 14 is a perspective view of the cassette.

Referring to FIGS. 12 and 13 of the drawings, there is illustrated a drive assembly 22 for rotating a magnetic array 20 relative to the wafer 12. The assembly 22 is disposed within the platen 15, which itself may comprise means 23 for controlling the temperature of the platen 15. The array 20 is housed within a circular cassette 201 as illustrated in FIG. 14 of the drawings, located within the recess 15a of the platen 15, and the magnets 21 are located within elongate channels 202 formed in an upper surface of the cassette 201. The channels 202 extend across the cassette 201 in a substantially parallel configuration and are separated into a first set of channel portions 202a which extend to a first lateral side of a central axis of the cassette 201 and a second set of channel portions 202b which extend to a second lateral side of the central axis.

Figure 15:
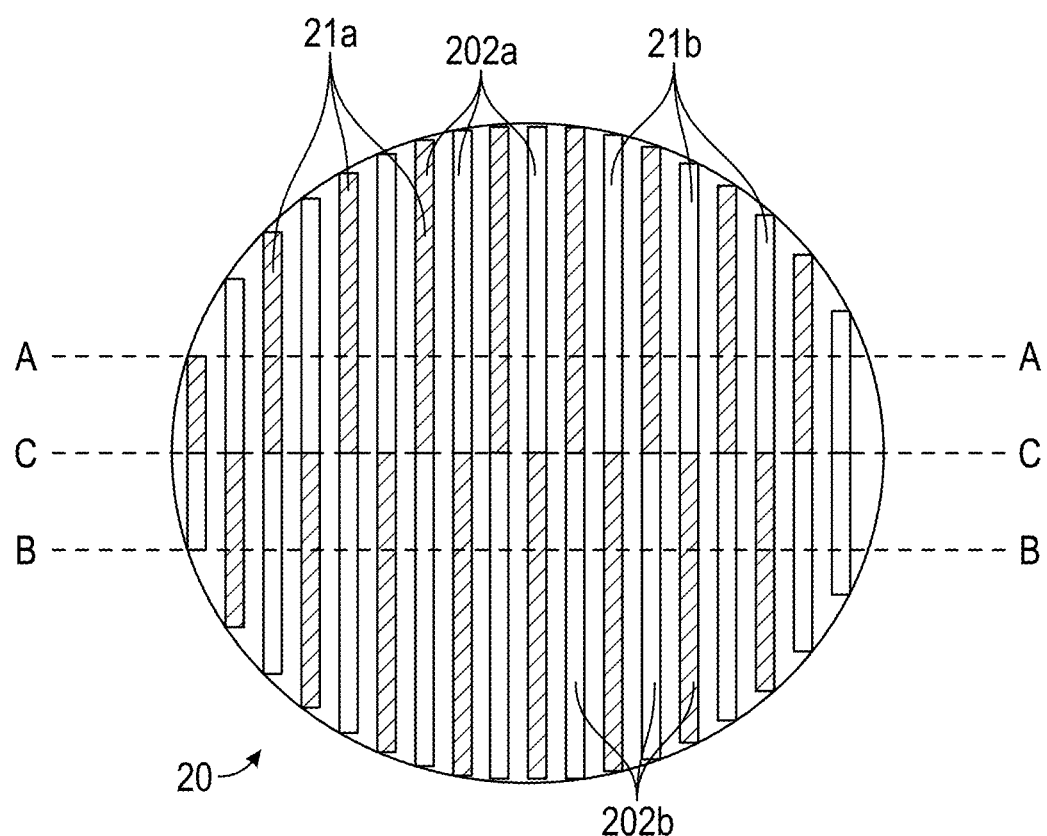
FIG. 15 is a plan view of the cassette showing the arrangement of magnets within the cassette.

Referring to FIG. 15 of the drawings, the first set of channel portions 202a are aligned with the second set of channel portions 202b, and each of the first and second sets of channel portions 202a, 202b are separately populated with magnets 21 which are sized to fit the respective channel portion 202a, 202b. The magnets 21 within each set are orientated such that the magnetic pole arranged uppermost alternates between a north and south pole 21a, 21b, along each set. Similarly, the portion 202a, 202b of each channel 202 at either side of the central axis comprise magnets 21 with opposite magnetic poles arranged uppermost. However, the skilled person will recognise that other arrangements of magnets 21 within the array 20 may be exploited. The cassette 201 and thus magnets 21 are configured to rotate within the recess 15a by the drive assembly 22 which comprises a drive shaft or spindle 221 that extends along a central axis of the platen 15 and is coupled at a proximal end thereof to a motor (not shown) or similar, disposed outside the chamber 11 for rotating the spindle 221. In this respect, the spindle 221 may be sealed to the chamber 11 via one or more bellows 223 to minimise any gaseous exchange between the interior of the chamber 11 and the surrounding environment. A proximal region of the spindle 221 extends through a passage 203 formed within the cassette 201 and which is centred upon a rotational axis thereof. The passage 203 extends from an underside of the cassette 201 and terminates at a base of a recess 204 formed within the cassette 201 at a central region thereof. A proximal end of the spindle 221 terminates at a central wafer lift 222, which in normal operation, nests within the recess 204.

The spindle 221 and cassette 201 are rotationally coupled together such that rotation of the spindle 221 causes rotation of the cassette 201. The rotational coupling may be achieved by exploiting a spindle and passage which separately comprise a polygonal shaped cross-section. Alternatively, the spindle 221 and cassette 201 may be rotationally coupled via a key (not shown) which extends within a keyway separately formed within a side wall of the spindle 221 and passage 203. However, in either embodiment, the spindle 221 and thus central wafer lift 222 are configured for longitudinal movement along the rotational axis of the cassette 201 via one or more actuators (not shown), so that the central wafer lift 222 can be raised above an upper surface of the platen 15 to lift a wafer 12 disposed thereon above the upper surface of the platen 15, and subsequently lowered within the recess 204.

The central wafer lift 222 is shaped to suitably support the wafer 12 in a raised configuration and is configured to extend below an upper surface 15b of the platen 15 when in the lowered configuration to avoid contacting the wafer 12. The recess 204 for the central wafer lift 222 may be formed within a region of the cassette 201 disposed between channels 202 to avoid disturbing the magnetic field pattern generated by the magnetic array 20. Alternatively, in situations where the recess 204 occupies regions of the cassette 201 which extend into the channels 202, then the central wafer lift 222 may also incorporate one or more magnets 21 to maintain the uniformity of the magnetic field generated by the array 20.

Figure 16:
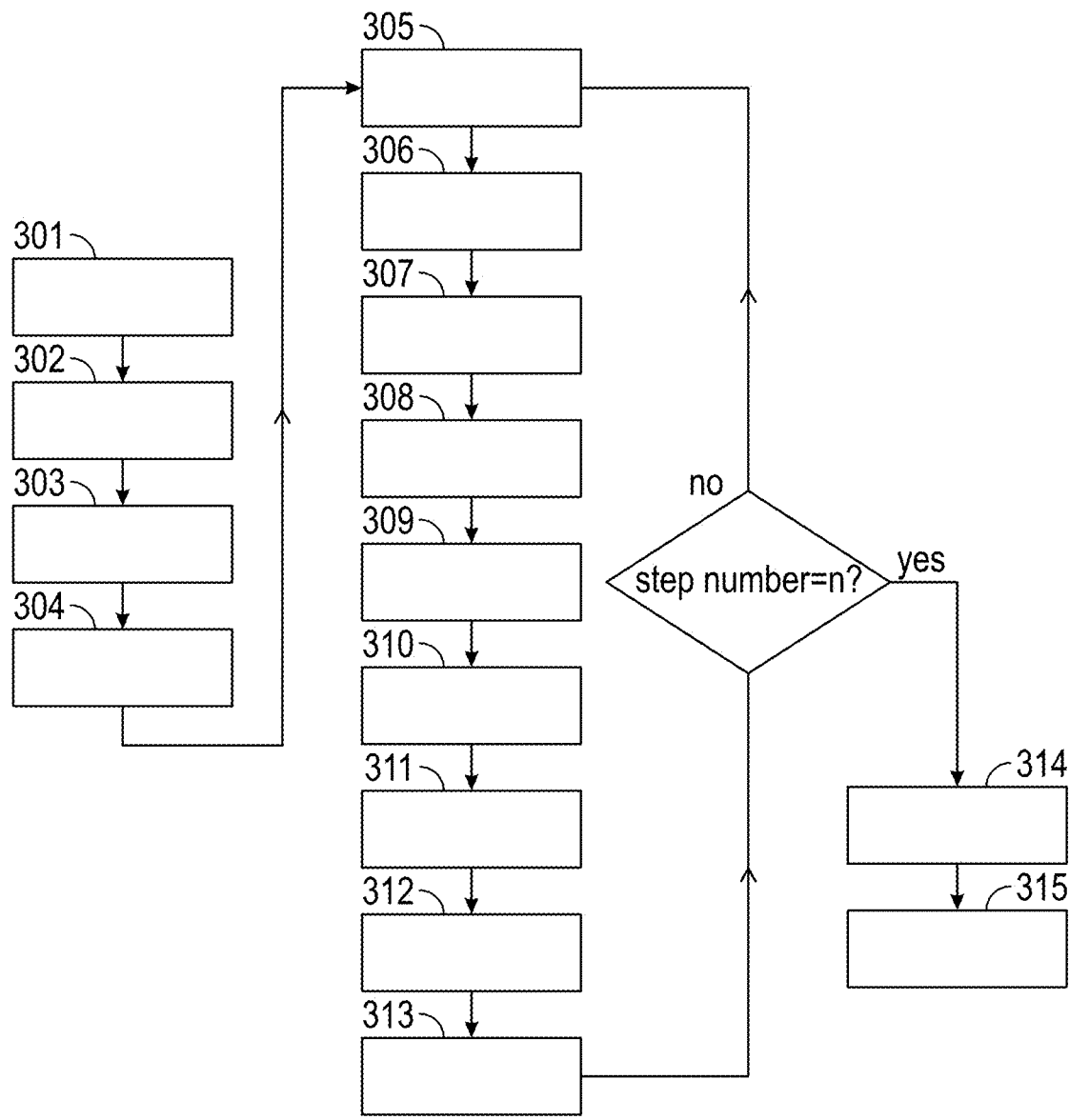
FIG. 16 is a flow chart illustrating the steps associated with a method of controlling stress variation in a material layer formed via physical vapour deposition according to a second embodiment of the present invention.

Referring to FIG. 16 of the drawings, there is illustrated a flowchart outlining the steps associated with a method 300 of controlling stress variation in a material layer formed via pulsed DC physical vapour deposition according to second embodiment of the present invention. When exploiting the magnetic array 20 and drive assembly 22 using the method 300 of the second embodiment, the wafer 12 is first placed upon the upper surface 15b of the platen 15 within chamber 11 over the cassette 201, at step 301. The target 13 is also placed within the chamber at step 302 and the desired gas/gas mixture is introduced into the chamber 11 at step 303, via the inlet 14. The number n, of discrete deposition steps required to average the radial component of thickness non-uniformity, is then selected at step 304. This may be four or five discrete steps, for example, whereby each deposition process step is permitted to proceed for a predefined period.

The method 300 subsequently comprises rotating the cassette at step 305 relative to the wafer 12 to provide for a uniform magnetic (B) field across the surface of the wafer 12. The plasma is then generated at step 306 by applying a pulsed DC potential between the anode ring 16a and target 13, and an RF bias is applied to the wafer 12 at step 307 using the RF power supply 18b.

The first deposition step then proceeds for the pre-derined period. After the first deposition step, the rotation is stopped at step 308, the plasma is extinguished at step 309 and the RF bias is removed at step 310. The central wafer lift 222 is subsequently raised using the actuators (not shown) to lift the wafer 12 from the platen 15 at step 311 and subsequently rotated through an angular range of 360/n relative to the platen 15, using the motor (not shown), at step 312. The wafer 12 is then lowered at step 313 to replace the wafer 12 upon the upper surface 15b of the platen 15 for a subsequent deposition process step. For example, for n=4, the wafer is rotated through 90° relative to the platen between deposition steps.

Figure 17:
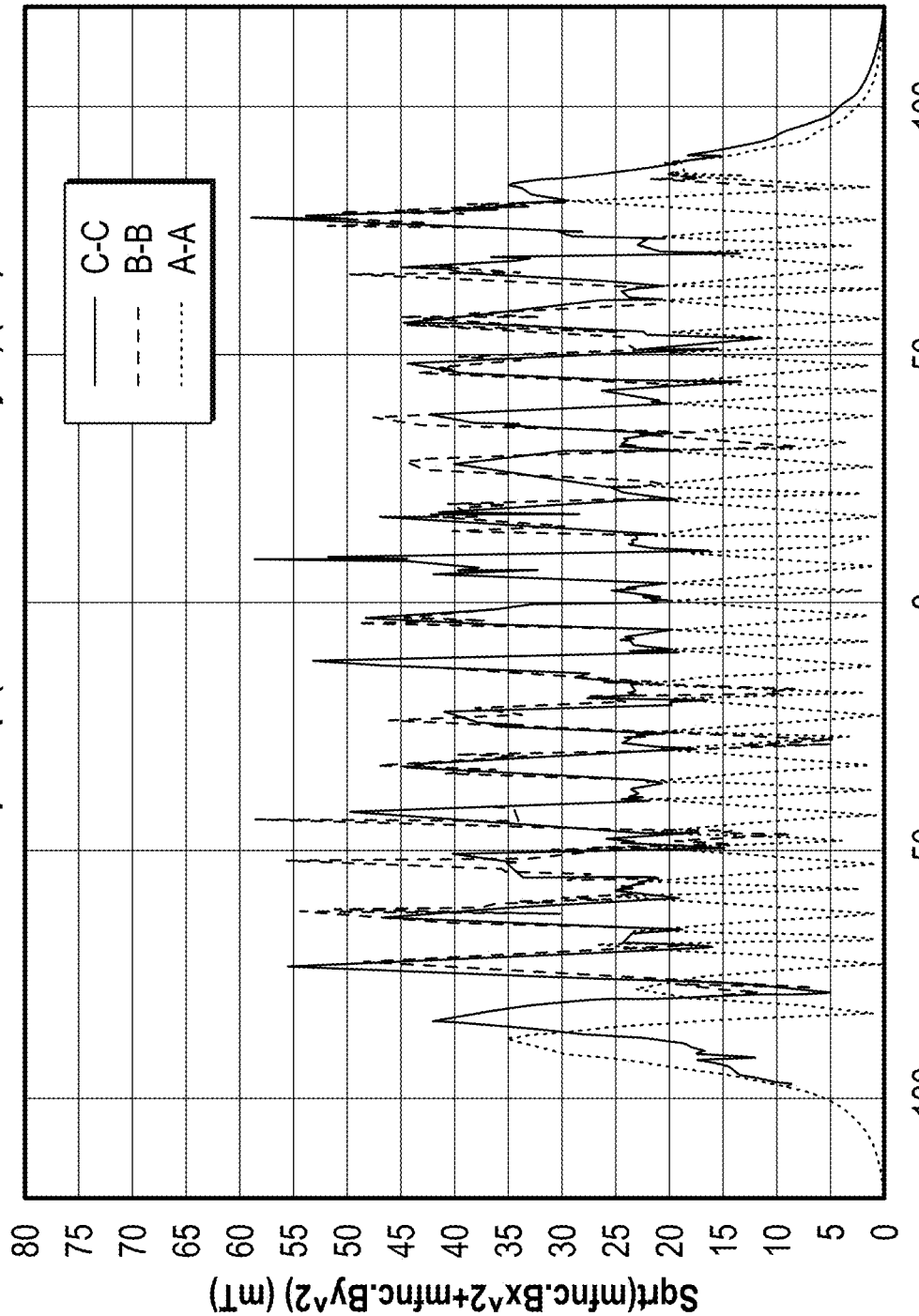
FIG. 17 is a graphical representation of the tangential ($B_{tangential}$) component of the magnetic field generated by the magnets within the cassette, taken along line A-A, B-B and C-C in FIG. 15.
Figure 18:
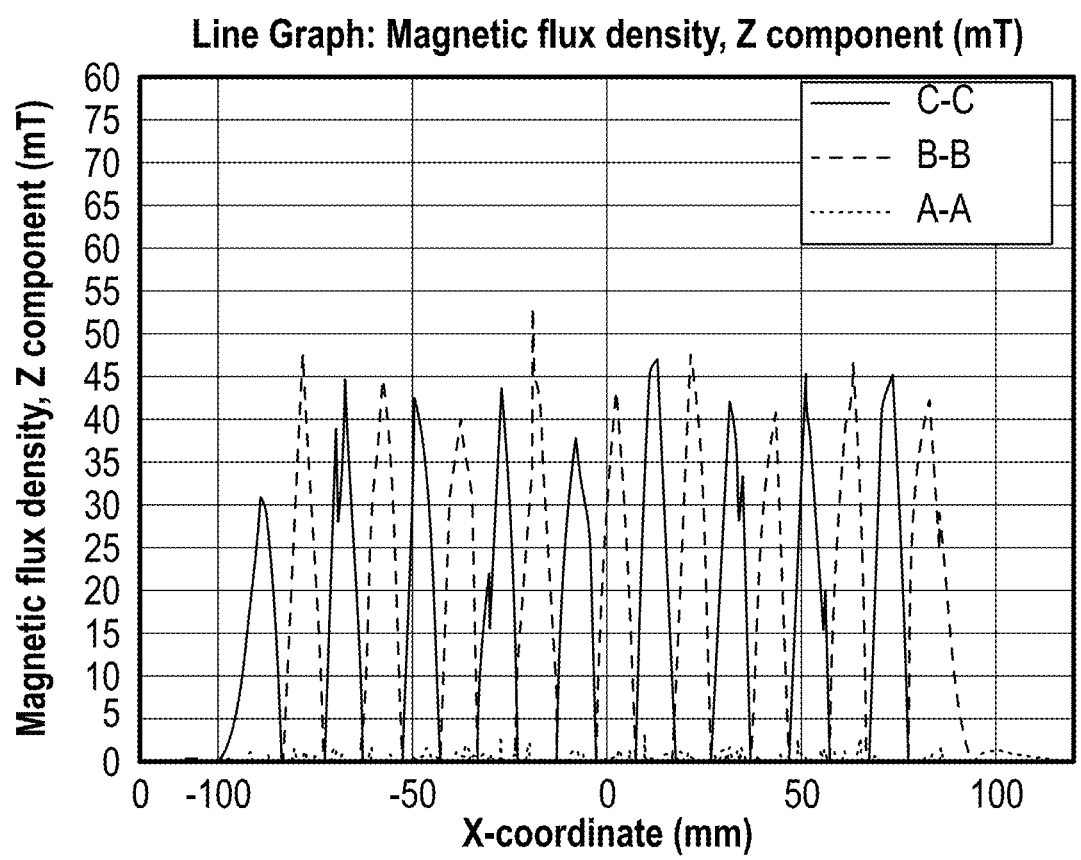
FIG. 18 is a graphical representation of the normal ($B_{normal}$) component of the magnetic field generated by the magnets within the cassette along line A-A, B-B and C-C in FIG. 15.

Referring to FIGS. 17 and 18 of the drawings, there is illustrated a graphical representation of the tangential ($B_{tangential}$) and normal ($B_{normal}$) components of the magnetic field generated by the array 20 when the cassette 201 is stationary relative to the wafer 12. Each graph illustrates the variation in field strength in milli-tesla along the cassette at three lateral positions across the cassette 201, namely at 25 mm from the central axis of the wafer to the first and second side thereof (illustrated with lines A-A and B-B), and also along the central axis (illustrated with line C-C). It is evident that there is a large variation in the field components across the wafer at each lateral position.

Figure 19:
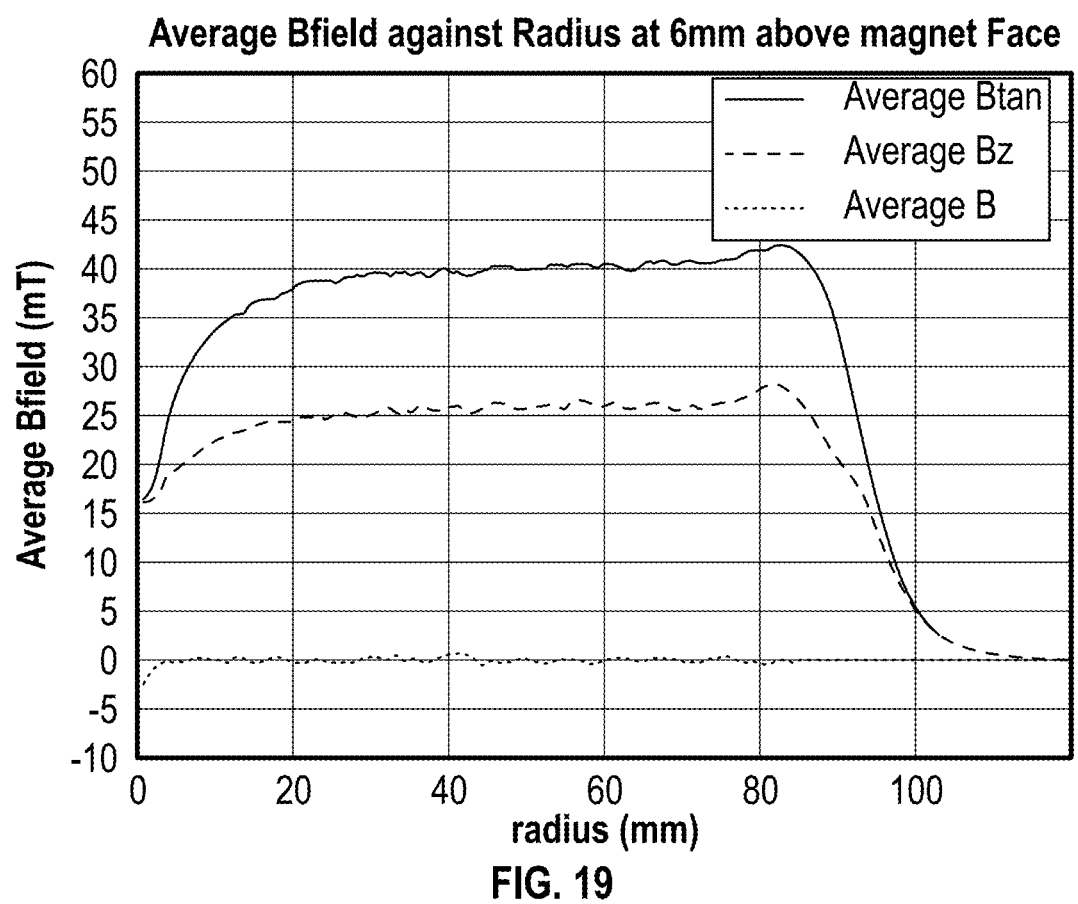
FIG. 19 is a graphical representation of the averaged normal and tangential components of the magnetic field generated by the magnets within the cassette during a rotation thereof.

FIG. 19 provides a graphical representation of the averaged normal and tangential components of the magnetic field generated by the cassette 201 during a rotation thereof. It can be seen that a highly uniform field filed is generated which correspondingly results in the deposition of a film with highly uniform properties.

Once each step of the deposition process has been completed, the chamber 11 is then be evacuated via an outlet (not shown) at step 314 and the wafer 12 with the layer formed thereon removed at step 315, for further processing for example.

What is claimed is:

1. A method of controlling stress variation in a material layer formed via pulsed DC physical vapour deposition, the method comprising the steps of:
   providing a chamber comprising a target from which the material layer is formed and a substrate upon which the material layer is formable, wherein the substrate is disposed on a platen such that the substrate is over a recess in an outer surface of the platen in the chamber;
   introducing a gas within the chamber;
   generating a plasma within the chamber using a pulsed DC potential between an anode ring within the chamber and the target;
   applying a first magnetic field proximate the target to substantially localise the plasma adjacent the target;
   applying an RF bias voltage to the substrate;
   applying a second magnetic field proximate the substrate that does not substantially interact with any other magnetic fields remote from the platen to steer gas ions from the plasma to selective regions upon the material layer formed on the substrate; and compacting the material layer on the substrate using the gas ions such that stress variation in a center of the substrate is within 400 MPa of a periphery of the substrate, wherein the second magnetic field is generated in a direction that is substantially perpendicular to a flat surface of the substrate from a magnetic array disposed in the recess of the platen, and wherein the gas ions steered by the second magnetic field are substantially unaffected by the first magnetic field.

2. A method according to claim 1, wherein the second magnetic field is applied at a central portion of the substrate.

3. A method according to claim 1, further comprising rotating the second magnetic field relative to the substrate.

4. A method according to claim 1 further comprising rotating the second magnetic field relative to the substrate as the material layer is formed.

5. A method according to claim 3, wherein the rotation take places about an axis which extends substantially perpendicular to the substrate.

6. A method according to claim 1, further comprising a plurality of deposition steps for forming the material layer, wherein the substrate is rotated relative to the platen prior to commencing each step.

7. A method according to claim 6, wherein the substrate is rotated through an angular range of 360°/n relative to the platen, between each deposition step, where n is the number of deposition steps.

* * * * *